(12) United States Patent
Adrian et al.

(10) Patent No.: US 10,027,133 B2
(45) Date of Patent: *Jul. 17, 2018

(54) SCALABLE HIGHLY AVAILABLE MODULAR BATTERY SYSTEM

(71) Applicant: Dell International L.L.C., Round Rock, TX (US)

(72) Inventors: Jason D. Adrian, Cedar Park, TX (US); Douglas L. Farley, Round Rock, TX (US)

(73) Assignee: Dell International L.L.C., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/416,423

(22) Filed: Jan. 26, 2017

(65) Prior Publication Data

US 2017/0179735 A1     Jun. 22, 2017

Related U.S. Application Data

(63) Continuation of application No. 13/975,864, filed on Aug. 26, 2013, now Pat. No. 9,583,794.

(51) Int. Cl.
| | |
|---|---|
| *H02J 7/00* | (2006.01) |
| *H01M 10/44* | (2006.01) |
| *H01M 10/48* | (2006.01) |
| *H01M 10/42* | (2006.01) |

(52) U.S. Cl.
CPC ......... *H02J 7/0013* (2013.01); *H01M 10/425* (2013.01); *H01M 10/441* (2013.01); *H01M 10/482* (2013.01); *H02J 7/0072* (2013.01); *H01M 2010/4271* (2013.01); *H01M 2220/10* (2013.01)

(58) Field of Classification Search
CPC ....... Y02E 60/12; H01M 10/44; H02J 7/0093; H02J 7/0075; Y02T 10/7005
USPC ......................................................... 320/126
See application file for complete search history.

(56) References Cited

U.S. PATENT DOCUMENTS

| | | | |
|---|---|---|---|
| 4,961,151 A | | 10/1990 | Early et al. |
| 5,187,425 A | * | 2/1993 | Tanikawa ............... H02J 7/0091 320/138 |
| 2002/0154464 A1 | * | 10/2002 | Vinciarelli .......... H01L 27/0251 361/56 |
| 2005/0170245 A1 | | 8/2005 | Vartak et al. |

(Continued)

*Primary Examiner* — Arun Williams
(74) *Attorney, Agent, or Firm* — Winthrop & Weinstine, P.A.

(57) ABSTRACT

A modular battery pack system including a plurality of battery sub-modules operably connected in parallel and an isolation system configured to discretely isolate any one of the battery sub-modules from the remaining battery sub-module(s). The isolation system, in one embodiment, may utilize an ORing FET for each of the battery sub-modules, with each ORing FET operably connected at its input with an output of a corresponding battery sub-module and operably connected at its output with the output of the other ORing FETs. The modular battery pack system may further include a conditioning system for conditioning a battery sub-module by discharging at least a portion of the battery sub-module. Each battery sub-module may be operably and discretely connected to the conditioning system, such that conditioning is selectively applicable to any one or more of the battery sub-modules.

20 Claims, 1 Drawing Sheet

(56) References Cited

U.S. PATENT DOCUMENTS

| | | |
|---|---|---|
| 2005/0191528 A1 | 9/2005 | Cortes et al. |
| 2008/0030263 A1 | 2/2008 | Frederick et al. |
| 2009/0325056 A1* | 12/2009 | Greening ................ G06F 1/189 |
| | | 429/121 |
| 2011/0089904 A1 | 4/2011 | Ward |
| 2012/0038322 A1 | 2/2012 | Moorhead et al. |
| 2013/0063073 A1* | 3/2013 | Kawasaki ............. H02J 7/0027 |
| | | 320/101 |
| 2013/0093383 A1 | 4/2013 | Kim et al. |
| 2013/0214601 A1 | 8/2013 | Yang |

\* cited by examiner

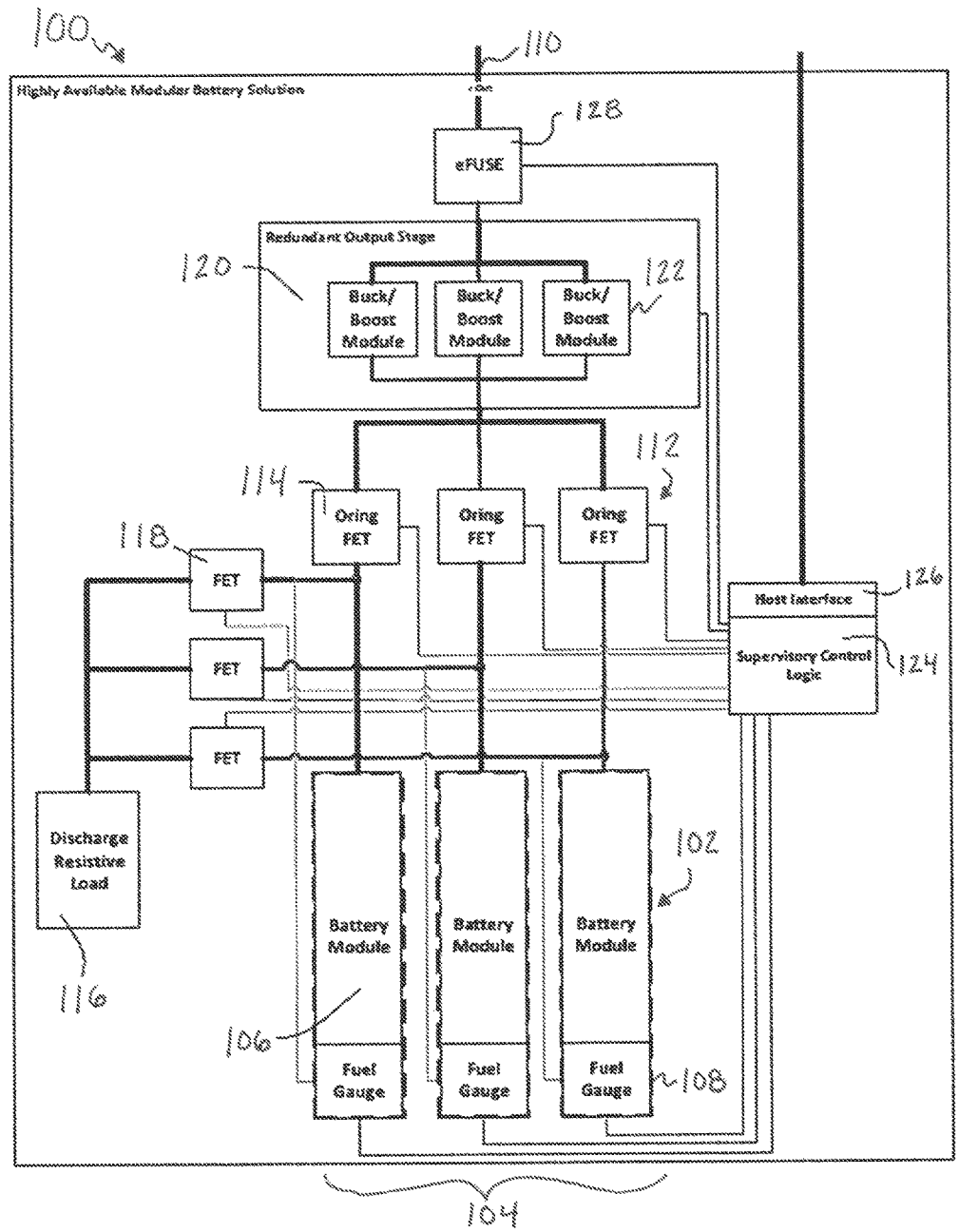

SCALABLE HIGHLY AVAILABLE MODULAR BATTERY SYSTEM

CROSS REFERENCE TO RELATED APPLICATION

This application is a continuation of U.S. application Ser. No. 13/975,864, filed Aug. 26, 2013, which is incorporated herein by reference in its entirety.

FIELD OF THE INVENTION

The present disclosure relates to battery pack systems. Particularly, the present disclosure relates to scalable, highly available, modular battery systems.

BACKGROUND OF THE INVENTION

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In many information handling systems, and particularly those consisting of or comprising data storage systems or appliances, batteries or battery packs are often used as part of a protection mechanism for critical cached data. Such a conventional protection mechanism typically consists of some sort of high speed volatile storage (e.g., DRAM), some sort of slower non-volatile storage, an energy source, and logic and data-movement elements. The protection is generally provided by utilizing the logic elements to migrate or de-stage data from volatile memory to non-volatile memory. In many cases, the energy source must be rather large in order to handle the time constraints on relocation of thousands of megabytes of data from the volatile storage to non-volatile storage.

Historically, large external uninterruptable power supplies (UPSs) have been utilized to keep not only the cached data, but the entire system running during a power failure. This poses challenges, as the capacity of the energy source increases to account for larger memory sizes, which in turn increases the potential for single points of failure within the energy subsystem and the corresponding exposure to data loss upon its failure. In traditional battery pack designs, these failures can exhibit in the form of shorts, and life and balancing problems, thus affecting battery cells.

Furthermore, traditional battery pack designs for many popular battery chemistries require conditioning and "learn" behaviors to gauge cell life. In many instances, this conditioning generally involves discharging a significant portion of the stored energy, which usually requires the caching mechanism to be shut down for an extended period of time, often ranging from several minutes to several hours. When the caching mechanism is shutdown during this conditioning, system capability is typically impacted, resulting in lower performance and poor customer experiences.

Thus, there is a need in the art for a scalable, highly available, modular battery system. Particularly, there is a need in the art for a battery pack design that is flexible, with multiple cell chemistry types, and is fault tolerant, serviceable, and reduces or eliminates the performance impact of conditioning or learn behaviors.

BRIEF SUMMARY OF THE INVENTION

The following presents a simplified summary of one or more embodiments of the present disclosure in order to provide a basic understanding of such embodiments. This summary is not an extensive overview of all contemplated embodiments, and is intended to neither identify key or critical elements of all embodiments, nor delineate the scope of any or all embodiments.

The present disclosure, in one embodiment, relates to a modular battery pack system including a plurality of battery sub-modules operably connected in parallel and an isolation system configured to discretely isolate any one of the battery sub-modules from the remaining battery sub-module(s). The isolation system, in one embodiment, may utilize an ORing FET for each of the battery sub-modules, with each ORing FET operably connected at its input with an output of a corresponding battery sub-module and operably connected at its output with the output of the other ORing FETs. The modular battery pack system may further include a conditioning system for conditioning a battery sub-module by discharging at least a portion of the battery sub-module. Each battery sub-module may be operably and discretely connected to the conditioning system, such that conditioning is selectively applicable to any one or more of the battery sub-modules. In one embodiment, each battery sub-module may be operably and discretely connected to the conditioning system via a field-effect transistor, such that conditioning is selectively applicable via the field-effect transistors to any one or more of the battery sub-modules. In additional embodiments, one or more buck-boost modules may be operably connected in parallel between an output of the isolation system and an output of the battery pack system. A supervisory control unit may be operably connected with the isolation system and automatically control selected isolation of the battery sub-modules. Still further, the supervisory control unit may be operably connected with the conditioning system and automatically control both selected isolation and conditioning of the battery sub-modules. The isolation system may also be configured for accepting connection of an additional battery sub-module in parallel with the initial plurality of battery sub-modules to increasingly scale energy capacity of the battery pack system. Likewise, a spare battery sub-module may be operably connected in parallel with the initial plurality of battery sub-modules, wherein the spare battery sub-module is initially discretely isolated from the plurality of battery sub-modules via the isolation system, and further wherein the isolation system is configured to replace one of the plurality of battery sub-modules with the spare battery sub-module by select isolation of the one battery sub-module from the remaining battery sub-module(s) and select de-isolation of the spare battery sub-module. In some cases, the isolation system may replace a battery sub-module with the spare battery sub-module upon substantial failure of that battery sub-module.

The present disclosure, in another embodiment, relates to a method for providing a modular battery system. The method may generally include selectively and discretely isolating a battery sub-module from a plurality of battery sub-modules operably connected in parallel. The method may also include selectively and discretely conditioning the isolated battery sub-module by discharging at least a portion of the isolated battery sub-module. Field-effect transistors may be utilized for selectively and discretely isolating and conditioning the isolated battery sub-module. As indicated above, the system may be increased by adding additional battery sub-modules or fail-safes may be incorporated by employing a spare battery sub-module.

The present disclosure, in still another embodiment, relates to a battery pack system having an isolation system operably connected to the output of at least two battery modules and configured to isolate any one of the battery modules while any remaining battery sub-module(s) continue to provide power to an output of the battery pack system. Isolation of any one of the battery sub-modules may be automatically controlled by a supervisory control unit based on feedback about the battery pack system.

While multiple embodiments are disclosed, still other embodiments of the present disclosure will become apparent to those skilled in the art from the following detailed description, which shows and describes illustrative embodiments of the invention. As will be realized, the various embodiments of the present disclosure are capable of modifications in various obvious aspects, all without departing from the spirit and scope of the present disclosure. Accordingly, the drawings and detailed description are to be regarded as illustrative in nature and not restrictive.

BRIEF DESCRIPTION OF THE DRAWINGS

While the specification concludes with claims particularly pointing out and distinctly claiming the subject matter that is regarded as forming the various embodiments of the present disclosure, it is believed that the invention will be better understood from the following description taken in conjunction with the accompanying FIGURE, in which:

FIG. 1 is a schematic illustration of a scalable, highly available, modular battery system in accordance with one embodiment of the present disclosure.

DETAILED DESCRIPTION

The present disclosure relates to novel and advantageous battery pack systems and methods for operating the same. Particularly, the present disclosure relates novel and advantageous systems and methods relating to scalable, highly available, modular battery systems.

For purposes of this disclosure, any system or information handling system described herein may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, a system or any portion thereof may be a personal computer (e.g., desktop or laptop), tablet computer, mobile device (e.g., personal digital assistant (PDA) or smart phone), server (e.g., blade server or rack server), a network storage device, or any other suitable device or combination of devices and may vary in size, shape, performance, functionality, and price. A system may include random access memory (RAM), one or more processing resources such as a central processing unit (CPU) or hardware or software control logic, ROM, and/or other types of nonvolatile memory. Additional components of a system may include one or more disk drives or one or more mass storage devices, one or more network ports for communicating with external devices as well as various input and output (I/O) devices, such as a keyboard, a mouse, touchscreen and/or a video display. Mass storage devices may include, but are not limited to, a hard disk drive, floppy disk drive, CD-ROM drive, smart drive, flash drive, or other types of non-volatile data storage, a plurality of storage devices, or any combination of storage devices. A system may include what is referred to as a user interface, which may generally include a display, mouse or other cursor control device, keyboard, button, touchpad, touch screen, microphone, camera, video recorder, speaker, LED, light, joystick, switch, buzzer, bell, and/or other user input/output device for communicating with one or more users or for entering information into the system. Output devices may include any type of device for presenting information to a user, including but not limited to, a computer monitor, flat-screen display, or other visual display, a printer, and/or speakers or any other device for providing information in audio form, such as a telephone, a plurality of output devices, or any combination of output devices. A system may also include one or more buses operable to transmit communications between the various hardware components.

One or more programs or applications, such as a web browser, and/or other applications may be stored in one or more of the system data storage devices. Programs or applications may be loaded in part or in whole into a main memory or processor during execution by the processor. One or more processors may execute applications or programs to run systems or methods of the present disclosure, or portions thereof, stored as executable programs or program code in the memory, or received from the Internet or other network. Any commercial or freeware web browser or other application capable of retrieving content from a network and displaying pages or screens may be used. In some embodiments, a customized application may be used to access, display, and update information.

Hardware and software components of the present disclosure, as discussed herein, may be integral portions of a single computer or server or may be connected parts of a computer network. The hardware and software components may be located within a single location or, in other embodiments, portions of the hardware and software components may be divided among a plurality of locations and connected directly or through a global computer information network, such as the Internet.

As will be appreciated by one of skill in the art, the various embodiments of the present disclosure may be embodied as a method (including, for example, a computer-implemented process, a business process, and/or any other process), apparatus (including, for example, a system, machine, device, computer program product, and/or the like), or a combination of the foregoing. Accordingly, embodiments of the present disclosure may take the form of an entirely hardware embodiment, an entirely software embodiment (including firmware, middleware, microcode, hardware description languages, etc.), or an embodiment combining software and hardware aspects. Furthermore, embodiments of the present disclosure may take the form of a computer program product on a computer-readable medium or computer-readable storage medium, having computer-executable program code embodied in the medium, that define processes or methods described herein. A processor or processors may perform the necessary tasks defined by the computer-executable program code. Computer-executable program code for carrying out operations of embodiments of the present disclosure may be written in an object oriented, scripted or unscripted programming language such as Java, Perl, PHP, Visual Basic, Smalltalk, C++, or the like. However, the computer program code for carrying out operations of embodiments of the present disclosure may also be written in conventional procedural programming languages, such as the C programming language or similar programming languages. A code segment may represent a procedure, a function, a subprogram, a program, a routine, a subroutine, a module, an object, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

In the context of this document, a computer readable medium may be any medium that can contain, store, communicate, or transport the program for use by or in connection with the systems disclosed herein. The computer-executable program code may be transmitted using any appropriate medium, including but not limited to the Internet, optical fiber cable, radio frequency (RF) signals or other wireless signals, or other mediums. The computer readable medium may be, for example but is not limited to, an electronic, magnetic, optical, electromagnetic, infrared, or semiconductor system, apparatus, or device. More specific examples of suitable computer readable medium include, but are not limited to, an electrical connection having one or more wires or a tangible storage medium such as a portable computer diskette, a hard disk, a random access memory (RAM), a read-only memory (ROM), an erasable programmable read-only memory (EPROM or Flash memory), a compact disc read-only memory (CD-ROM), or other optical or magnetic storage device. Computer-readable media includes, but is not to be confused with, computer-readable storage medium, which is intended to cover all physical, non-transitory, or similar embodiments of computer-readable media.

Various embodiments of the present disclosure may be described herein with reference to flowchart illustrations and/or block diagrams of methods, apparatus (systems), and computer program products. It is understood that each block of the flowchart illustrations and/or block diagrams, and/or combinations of blocks in the flowchart illustrations and/or block diagrams, can be but need not be implemented using computer-executable program code portions. These computer-executable program code portions may be provided to a processor of a general purpose computer, special purpose computer, or other programmable data processing apparatus to produce a particular machine, such that the code portions, which execute via the processor of the computer or other programmable data processing apparatus, create mechanisms for implementing the functions/acts specified in the flowchart and/or block diagram block or blocks. Alternatively, computer program implemented steps or acts may be combined with operator or human implemented steps or acts in order to carry out an embodiment of the invention.

Additionally, although a flowchart may illustrate a method as a sequential process, many of the operations in the flowcharts illustrated herein can be performed in parallel or concurrently. In addition, the order of the method steps illustrated in a flowchart may be rearranged for some embodiments. Similarly, a method illustrated in a flow chart could have additional steps not included therein or fewer steps than those shown. A method step may correspond to a method, a function, a procedure, a subroutine, a subprogram, etc.

As used herein, the terms "substantially" or "generally" refer to the complete or nearly complete extent or degree of an action, characteristic, property, state, structure, item, or result. For example, an object that is "substantially" or "generally" enclosed would mean that the object is either completely enclosed or nearly completely enclosed. The exact allowable degree of deviation from absolute completeness may in some cases depend on the specific context. However, generally speaking, the nearness of completion will be so as to have generally the same overall result as if absolute and total completion were obtained. The use of "substantially" or "generally" is equally applicable when used in a negative connotation to refer to the complete or near complete lack of an action, characteristic, property, state, structure, item, or result. For example, an element, combination, embodiment, or composition that is "substantially free of" or "generally free of" an ingredient or element may still actually contain such item as long as there is generally no measurable effect thereof.

As discussed above, in many such information handling systems, and particularly those consisting of or comprising data storage systems or appliances, batteries or battery packs are often used as part of a protection mechanism for critical cached data. Historically, however, large external UPSs have been utilized to keep not only the cached data, but the entire system running during a power failure, which poses challenges, as the capacity of the energy source increases to account for larger memory sizes, which in turn increases the potential for single points of failure within the energy subsystem and the corresponding exposure to data loss upon its failure. As discussed above, these failures can exhibit in the form of shorts, and life and balancing problems, thus affecting battery cells. Furthermore, traditional battery pack designs for many popular battery chemistries require conditioning, which usually requires the caching mechanism to be shut down for extended periods of time, ranging from several minutes to several hours, resulting in lower performance and poor customer experiences. The various embodiments of the present disclosure improve on existing battery pack systems and technologies and overcomes or reduces the impact of the disadvantages discussed above.

In general, the various embodiments of the present disclosure relate to improved battery pack systems. Particularly, the various embodiments of the present disclosure comprise a generally scalable, highly available, modular battery system. The various embodiments of battery systems of the present disclosure may be flexible, having multiple cell chemistry types, and may be fault tolerant, serviceable, and/or reduce or eliminate the performance impact of conditioning or learn behaviors, described above.

In one embodiment, the battery system of the present disclosure generally comprises a virtual or physical grouping of battery sub-modules that make up a complete battery system. A battery system 100 in accordance with an embodiment of the present disclosure is illustrated schematically in FIG. 1. Unlike a traditional battery pack where battery cells are simply combined in parallel or series to meet the desired or required energy and voltage requirements, battery system 100 may include two or more battery sub-modules 102 operably connected in parallel that combine and work together to form a "virtual" battery pack or system 104. From the perspective of a system operably connected with the battery system 100, the battery pack 104 appears as a single battery pack. However, internally, each battery sub-module 102 may be a fully-contained battery having one or more battery cells 106. Each battery sub-module 102 may include or comprise of any suitable battery cell type and/or battery chemistry. In some embodiments, each battery sub-module 102 may be of the same type and chemistry. However, in other embodiments, some or all of the battery sub-modules 102 may be of different type and/or chemistry. Each battery sub-module 102 may further include a battery fuel gauge module 108. The fuel gauge module 108 may be utilized to monitor the state-of-charge of a battery sub-module 102, and may for this purpose be operably connected with the output of a corresponding battery sub-module. In further embodiments, such a sub-module design permits the battery sub-modules 102 to each be either individual logical or physical modules and combinations thereof. While illustrated as having three battery sub-modules 102, any suitable number of battery sub-modules may be provided, including any number of sub-modules greater than one to create the redundant power aspect of the various embodiments of the present disclosure. Still further, in some embodiments, the battery sub-modules 102 may be substantially permanent fixtures or fixed assets of the battery pack 104, while in other embodiments, one or more of the battery sub-modules 102 may be configured as removable or replaceable, such that the battery sub-modules may each be removed and/or replaced, thereby improving long-term sustainability of the battery pack.

As illustrated in FIG. 1, each of the battery sub-modules 102 may be operably connected to a host system (not illustrated but operably connected at $v_{out}$ 110) via a logic or electrical isolation system 112. The isolation system 112 may be configured for the discrete and selectable isolation of any one of the battery sub-modules 102 from the host system. In one embodiment, the isolation system 112 may comprise an ORing field-effect transistor (FET) 114 for each battery sub-module 102. However, a FET carrying out any logic operation or combination of FETs may be utilized in place of an ORing FET, as desired, and the isolation system 112 is not limited to the use of solely ORing FETs. Likewise, while discussed with respect to ORing FETs, or FETs in general, the isolation system 112 may comprise any combination of logical and/or electrical components configured for the discrete and selectable isolation of any one of the battery sub-modules 102 in place of the ORing FETs 114. With reference, however, back to the embodiment illustrated in FIG. 1, each ORing FET may be connected at its input with one of the battery sub-modules 102 and may be connected at its output with the other ORing FETs of the isolation system 112. In this manner the ORing FETs may be selectively controlled to isolate or turn off one or more of the battery sub-modules 102 from the host system, while the remaining non-isolated battery sub-modules continue to feed the host system.

In a further embodiment, each of the battery sub-modules 102 may also be connected with a logical or electrical conditioning system 116 for conditioning the battery sub-modules. Each of the battery sub-modules 102 may be operably connected with the conditioning system 116 through a separate electrical connection and FET 118, thereby permitting discrete and selectable application of conditioning from the conditioning system to any one or more of the battery sub-modules. While discussed with respect to FETs 118, the battery system 100 may comprise any combination of logical and/or electrical components configured for the discrete and selectable application of conditioning from the conditioning system 116 to any one or more of the battery sub-modules 102 in place of FETs 118. Additionally, although not illustrated specifically as such, the FETs 118 or any other such logical and/or electrical component or combination of components for discrete and selectable application of conditioning from the conditioning system 116, may be considered a part of the conditioning system. As described above, conditioning generally involves charging and discharging, or otherwise discharging a significant portion of the stored energy of, a battery sub-module 102. In one embodiment, the conditioning system 116 may include a discharge resistive load, which may be used to discharge a load, which may be performed over a predetermined amount of time. The conditioning system 116 may further monitor the voltage and/or current output during discharge to determine the health level of a battery sub-module 102.

With the addition of the isolation 112 and conditioning 116 systems, the battery system 100 permits individual portions or sub-modules of the complete battery pack to be added, removed, isolated, and/or conditioned separately, while other portions or sub-modules continue to feed the host system. Such ability adds resiliency and redundancy to the system and provides for better customer experiences, whereby the whole battery pack 104 can avoid being taken offline during, for example, a conditioning or learn cycle. Rather, a single sub-module 102 (or multiple sub-modules less than all sub-modules) could perform a learn cycle while electrically isolated from the remaining sub-modules. This allows the host system to maintain operation at full performance.

In one embodiment, in addition to the redundancy in energy storage described above, the system 100 may further provide redundancy in an energy delivery subsystem 120, operably coupled between the output of the isolation system 112 and $v_{out}$ 110. The energy delivery subsystem 120 may include one or more buck-boost converters/transformers or modules 122 operably connected in parallel that allow for overlapping fault tolerance and permit the capability to be agnostic of battery cell chemistry, providing further modularity for a single battery design to support varying energy demands. The energy deliver subsystem 120 may provide gain or clipping to reduce or boost the voltage at the output of the isolation system 112.

The battery system 100 may further include a supervisory control unit or management unit 124. The supervisory control unit 124 may be operably connected with the battery sub-modules 102 and/or fuel gauge modules 108, the isolation system 112 and/or the individual ORing FETs 114, the conditioning system 116 and/or the individual FETs 118, the energy delivery subsystem 120, and/or any other components, as may be desired or required for operation of the battery system 100. The supervisory control unit 124, through its connections, may discretely manage and monitor the various components of the battery system 100 as well as the input and output of the various power stages.

More specifically, in one embodiment, the supervisory control unit 124 may control isolation of any given battery sub-module 102 through control of the ORing FETs 114 of the isolation system. Likewise, and typically in correspondence with the isolation system 112, the supervisory control unit 124 may control application of conditioning for any given battery sub-module 102 through control of FETs 118. The supervisory control unit 124 may utilize feedback from any of the other components to monitor the battery system 100. The supervisory control unit 124 may also include a host interface 126 for access to the supervisory control unit and overall management of the battery system 100 by the host system. The supervisory control unit 124, via the host interface 126, may provide a generally unified presentation of the battery system 100 for management as opposed to requiring individual management of the separate components. The supervisory control unit 124 may comprise any suitable logic or electrical hardware components, and may often consist of or comprise a microcontroller which has been programmed, and which, in some embodiments, may be reprogrammed, with a predetermined algorithm controlling the various components of the battery system 100. The algorithm may be configured based on, for example, the demands or requirements of the host system, which may also change over time.

The battery system 100 may further include any additional logical or electrical components, such as but not limited to electrical programmable fuse 128 or eFUSE electrically connected prior to $v_{out}$ 110. The eFUSE 128 allows for the dynamic real-time reprogramming of the circuits on a chip to change while the system is in operation. One application for the eFUSE 128 is to provide in-chip performance tuning, such that, if for example certain sub-systems fail or are consuming too much power, the system can instantly change its behavior by "blowing" the eFUSE 128. Other components may be selected and connected as desired or required, depending for example, on the needs of the host system.

In the above described embodiments, the battery sub-modules 102 may also promote mechanical interchangeability and/or expandability of the battery system 100, which may for example, depend on changing system demands. In some embodiments, for example, additional battery sub-modules 102 may be added and operably connected in parallel to give the overall battery pack 104 a larger energy capacity, thereby providing a quickly scalable architecture. In still further embodiments, the above described embodiments may include or permit additional battery sub-modules 102 as replacement spares, to be included beyond the desired battery capacity, and which are available in the event that one of the non-spare battery sub-modules fails or significantly degrades. Such additional sparing can allow for N+1, N+2, . . . N+n battery pack designs, whereby failure of a single battery sub-module 102 will not compromise the availability of a base N sub-modules, since a failed batter sub-module can be quickly replaced with a spare sub-module via particular selection and isolation of the sub-modules using the isolation system 112. The isolation system and methods therefor described above allow for such spare battery sub-modules to remain isolated in a sort of "sleep" state, to be brought online at a later time when required or desired to, for example, add to the capacity of the battery pack 104 or replace a failed or failing sub-module.

The various embodiments of the present disclosure are advantageous for a variety of reasons. Although not limited to such advantages, the isolation 112 and conditioning 116 systems permit the battery system 100 to individually add, remove, isolate, and/or condition individual portions or sub-modules of the complete battery pack, while other portions or sub-modules continue to feed the host system. These features support redundancy and resiliency of the battery system 100, and reduce or eliminate single points of failure or cascaded failures. The battery system 100 is truly scalable as well as highly available and permits routine maintenance functions to be performed on the battery sub-modules 102 while maintaining power for a host system. In addition, the various embodiments of the present disclosure permit a standardized battery pack design that may be used across multiple appliances/host systems and across multiple industries.

While the various embodiments herein have been described with respect to a generic host system and may indeed be utilized to provide power to any type of host system or other information handling system, the various embodiments of the present disclosure may be particularly useful in the context of information handling systems consisting of or comprising data storage systems or appliances, where batteries or battery packs are often used as part of a protection mechanism for critical cached data. Embodiments of information handling systems having a storage center comprising mass storage devices, such as but not limited to disk drive and solid state drive systems, or virtual disk drive systems, that may include a battery system 100 of the type disclosed in the present disclosure, are described in U.S. Pat. No. 7,613,945, titled "Virtual Disk Drive System and Method," issued Nov. 3, 2009, U.S. Pat. No. 8,468,292, titled "Solid State Drive Data Storage System and Method," issued Jun. 18, 2013, and U.S. patent application Ser. No. 13/429,511, titled "Single-Level Cell and Multi-Level Cell Hybrid Solid State Drive," filed Mar. 26, 2012, each of which is incorporated by reference herein in its entirety. Additionally, the various embodiments are not limited to use with only information handling systems, but may be utilized for any appliance/host system and in any industry, particularly industries utilizing appliances/host systems relying on internal energy sources.

In the foregoing description, various embodiments of the present disclosure have been presented for the purpose of illustration and description. They are not intended to be exhaustive or to limit the invention to the precise form disclosed. Obvious modifications or variations are possible in light of the above teachings. The various embodiments were chosen and described to provide the best illustration of the principals of the disclosure and their practical application, and to enable one of ordinary skill in the art to utilize the various embodiments with various modifications as are suited to the particular use contemplated. All such modifications and variations are within the scope of the present disclosure as determined by the appended claims when interpreted in accordance with the breadth they are fairly, legally, and equitably entitled.

We claim:

1. A modular battery pack system comprising:
   a plurality of battery sub-modules operably connected in parallel; and
   an isolation system configured to discretely isolate any one of the battery sub-modules from the remaining battery sub-module(s); and
   a spare battery sub-module operably connected in parallel with the plurality of battery sub-modules and initially discretely isolated from the plurality of battery sub-modules via the isolation system;
wherein the isolation system is configured to de-isolate the spare battery sub-module to increase energy capacity of the battery pack system or to replace one of the plurality of battery sub-modules.

2. The modular battery pack system of claim 1, wherein the isolation system comprises an ORing field-effect transistor (FET) for each of the battery sub-modules, with each ORing FET operably connected at its input with an output of a corresponding battery sub-module and operably connected at its output with outputs of the other ORing FETs.

3. The modular battery pack system of claim 1, further comprising a conditioning system for conditioning a battery sub-module by discharging at least a portion of the battery sub-module.

4. The modular battery pack system of claim 3, wherein each battery sub-module is operably and discretely connected to the conditioning system, such that conditioning is selectively applicable to any one or more of the battery sub-modules.

5. The modular battery pack system of claim 3, wherein each battery sub-module is operably and discretely connected to the conditioning system via a field-effect transistor (FET), such that conditioning is selectively applicable via the FETs to any one or more of the battery sub-modules.

6. The modular battery pack system of claim 1, further comprising one or more buck-boost modules operably connected in parallel between an output of the isolation system and an output of the battery pack system.

7. The modular battery pack system of claim 1, further comprising a supervisory control unit operably connected with the isolation system automatically controlling selected isolation of the battery sub-modules.

8. The modular battery pack system of claim 4, further comprising a supervisory control unit operably connected with the isolation system and the conditioning system automatically controlling selected isolation and conditioning of the battery sub-modules.

9. The modular battery pack system of claim 8, wherein the supervisory control unit comprises a host interface for access to the supervisory control unit by a host system sourced by the battery pack system.

10. The modular battery pack system of claim 1, wherein the isolation system is configured to replace one of the plurality of battery sub-modules with the spare battery sub-module by select isolation of the one battery sub-module from the remaining battery sub-module(s) and select de-isolation of the spare battery sub-module.

11. The modular battery pack system of claim 10, wherein the isolation system automatically replaces the one battery sub-module with the spare battery sub-module upon substantial failure of the one battery sub-module.

12. A method for providing a modular battery system, the method comprising:

managing an isolation system for selectively and discretely isolating a battery sub-module from a plurality of battery sub-modules operably connected in parallel;
maintaining a spare battery sub-module operably connected in parallel with the plurality of battery sub-modules and initially discretely isolated from the plurality of battery sub-modules; and
de-isolating the spare battery sub-module via the isolation system to increase energy capacity of the battery system or to replace one of the plurality of battery sub-modules.

13. The method of claim 12, wherein the isolation system comprises an ORing field-effect (FET) for each of the battery sub-modules, with each ORing FET operably connected at its input with an output of a corresponding battery sub-module and operably connected at its output with outputs of the other ORing FETs.

14. The method of claim 12, further comprising selectively and discretely conditioning any one battery sub-module of the plurality of battery sub-modules by isolating the one battery sub-module and discharging at least a portion of the one battery sub-module.

15. The method of claim 14, further comprising utilizing field-effect transistors (FETs) for selectively and discretely isolating and conditioning the one battery sub-module.

16. The method of claim 13, wherein one or more buck-boost modules is operably connected in parallel between an output of the isolation system and an output of the battery pack system.

17. The method of claim 12, wherein the spare battery sub-module is de-isolated to replace one of the plurality of battery sub-modules, the method further comprising isolating the one battery sub-module.

18. The method of claim 17, wherein the one battery sub-module is replaced with the spare battery sub-module upon substantial failure of the one battery sub-module.

19. A battery pack system comprising:
an isolation system operably connected to the output of at least two battery sub-modules and configured to isolate any one of the battery sub-modules while any remaining battery sub-module(s) continue to provide power to an output of the battery pack system; and
a spare battery sub-module operably connected with the at least two battery sub-modules and initially discretely isolated from the at least two battery sub-modules via the isolation system;
wherein the isolation system is configured to de-isolate the spare battery sub-module to increase energy capacity of the battery pack system or to replace one of the at least two battery sub-modules.

20. The battery pack system of claim 19, wherein the isolation system automatically replaces the one battery sub-module with the spare battery sub-module upon substantial failure of the one battery sub-module.

* * * * *